United States Patent
Phan et al.

(10) Patent No.: US 6,190,518 B1
(45) Date of Patent: Feb. 20, 2001

(54) DEVICE FOR REDUCING PLASMA ETCH DAMAGE AND METHOD FOR MANUFACTURING SAME

(75) Inventors: Tony T. Phan; Tom J. Goodwin, both of Austin; John K. Lowell, Round Rock, all of TX (US)

(73) Assignee: Advanced Micro Devices, Inc., Sunnyvale, CA (US)

(*) Notice: Under 35 U.S.C. 154(b), the term of this patent shall be extended for 0 days.

(21) Appl. No.: 08/095,147

(22) Filed: Jul. 20, 1993

(51) Int. Cl.[7] .................................................. C23C 14/34
(52) U.S. Cl. ............................. 204/298.31; 204/192.32
(58) Field of Search ..................... 204/298.31, 298.34, 204/298.35, 298.37, 298.39, 192.32, 192.35, 192.37; 257/48

(56) References Cited

U.S. PATENT DOCUMENTS

| | | | |
|---|---|---|---|
| 4,298,443 | 11/1981 | Maydan | 204/192.32 |
| 4,473,455 | * 9/1984 | Dean et al. | 204/298.15 |
| 4,496,448 | * 1/1985 | Tai et al. | 204/192.32 |
| 4,508,978 | 4/1985 | Reddy | 307/482 |
| 4,818,359 | 4/1989 | Jones et al. | 204/298.06 |
| 4,943,537 | * 7/1990 | Harrington, III | 437/34 |
| 5,089,746 | 2/1992 | Rosenblum et al. | 315/111.81 |
| 5,292,399 | * 3/1994 | Lee et al. | 204/298.31 |

OTHER PUBLICATIONS

Singer, "Evaluating Plasma Etch Damage", Semiconductor International, (1992), pp. 78–81, May.*

* cited by examiner

Primary Examiner—Rodney McDonald
(74) Attorney, Agent, or Firm—Kevin L. Daffer; Conley, Rose & Tayon

(57) ABSTRACT

An improved sputter etching technique is provided for substantially preventing or reducing plasma etch damages associated with sputter etching. The plasma etch technique can utilize a semiconductor wafer having at least one diode formed within an inactive region of the wafer near the outer periphery of the wafer. The diode is capable of preventing charge transfer or arcing between the grounded anode and the p-channel gate region. By placing a diode within the inactive region of the wafer, problems such as gate oxide breakdown, threshold voltage skew, flat-band voltage skew, etc. can be minimized or substantially reduced. Alternatively, a standard wafer not having an implanted or diffused diode can be utilized to obtain similar beneficial results provided the sputter etch anode is retrofitted to include a diode placed between the anode and the ground terminal. Similar to the diode placed on the wafer, the retrofitted anode is used to provide a depletion region for preventing charge transfer therethrough.

14 Claims, 6 Drawing Sheets

DEVICE FOR REDUCING PLASMA ETCH DAMAGE AND METHOD FOR MANUFACTURING SAME

BACKGROUND OF THE INVENTION

1. Field of the Invention

This invention relates to radio frequency (rf) sputter etch systems and more particularly to a device configured upon a semiconductor wafer or upon the sputter etch system which reduces damage associated with the sputter etch.

2. Background of the Relevant Art

The process of sputtering and sputter-etching has been studied and used for many years. More recent advances in sputter technology has led to the use of rf power systems for driving the sputter electrode. See, e.g., B. Chapman, "Glow Discharge Processes," J. Wiley and Sons, New York, N.Y., 1980, pp. 135–173. RF sputtering includes both the deposition of thin films or the removal of thin films. Depending upon whether the object is placed upon the cathode or anode, either deposition or etching of thin films can occur. RF sputtering is sometimes used for deposition or etching of insulators which cannot easily be performed using direct current (dc) techniques due to substrate and target charging. RF sputter deposition is widely used for insulators such as silicon dioxide, aluminum dioxide, and/or other oxides where the substrate temperature limits preclude other techniques. Conversely, sputter etching is often used for pattern transfer, but because sputter etching is a high-energy process, it is rarely used for patterning thick films, except where the energy requirements can be lowered using chemical reaction (RIE) techniques.

Sputter etching using rf power is sometimes used to remove surface oxides in contact areas prior to metal sputter deposition. This has been shown to be effective for making low-resistance contact between successive aluminum thin-film wiring layers on semiconductor devices. Accordingly, second metallization layers can make good electrical contact to underlying layers due to the effective removal of native oxides which naturally grow within the contact areas prior to deposition. See, e.g., Rossnagel, S., et al., "Handbook of Plasma Processing Technology," Noyes Publ., Park Ridge, N.J., 1990, pp. 154–157.

It is well recognized that rf discharges generally occur at relatively high voltage (600–1500 volts) and at high frequency (13.56 MHz). Plasma is formed near the wafer surface by breakdown of the gas within the sputter etch chamber. Electrons are repelled from the insulating layer (i.e., from the native oxide within the contact area) for most of the rf cycle, resulting in a positive time-averaged space charge. However, the cathode is usually smaller than the anode so that a high negative dc bias is developed on it with respect to the plasma. The cathode electrode and electrically connected wafer is bombarded at high energy by ions within the plasma during the negative portion of the applied voltage, and by electrons during the positive portion of the applied voltage. The resulting flow of ions and electrons during each cycle must be equal in order to preserve necessary charge neutrality. The electrons, being highly mobile, can easily provide enough charge over a small fraction of the cycle to neutralize the positive ion charge which flows during a majority of the cycle.

The bombardment of high energy ions upon the insulating layer dislodges atoms from the layer which are then accelerated by an applied electric field toward what is commonly called a "catcher plate" placed within the etch chamber. The catcher plate functions similar to an anode and preferably has deep cavities similar to a honeycomb structure, and also should be well grounded with low-conductance, wide straps or foils to prevent self-bias.

Although plasma etching using rf sputtering techniques is well suited to provide fine-line removal of native oxides in an anisotropic fashion, there are many disadvantages associated with plasma etch as reported in Singer, P., "Evaluating Plasma Etch Damage," *Semiconductor International,* May, 1992, pp. 78–81. Sputter etch can cause significant damage to the active regions within a semiconductor wafer. As defined herein, "active regions" refer to areas within a semiconductor having elements which can be activated in order to perform the specified functions of the integrated circuit defined thereon. Thus, active regions include those regions having passive or active elements (capacitors, resistors, transistors, etc.) necessary to carry forward the operation of the integrated circuit. Conversely, "inactive regions" are those regions which are defined outside the active regions and do not provide direct functionality of the integrated circuit. Generally, inactive regions are formed outside the die or integrated circuit area. Inactive regions, found near the outer periphery of the wafer, are generally unsuitable for accommodating an entire die. Inactive regions are usually discarded after the die are scribed and removed from the wafer. As described in the article to Singer, plasma etch can induce damage within the active area and may cause (i) gate oxide breakdown, (ii) high reverse leakage current, (iii) low minority carrier lifetime, (iv) foreign matter contamination of the silicon surface, (v) short order crystalline damage of the silicon surface, and (vi) radiation and lattice damage contamination from resist etch residues. The damage can result in skewed current-voltage transconductance, skewed flat-band voltage, and skewed threshold voltage, all of which are described in the Singer article.

It is possible to erase the effects of the damage caused by plasma etch by using a subsequent thermal annealing process. Annealing requires either a gradual or rapid heating of the wafer substrate in order to, inter alia, realign the interstitual defects caused by high energy ion bombardment. In many instances, rapid thermal anneal (RTA) requires temperatures exceeding, for example, 800° C. or 900° C. After a first metallization layer is deposited, and native oxides are sputter etch removed to allow contact with subsequent metallization layers, annealing can no longer be used to erase the deleterious effects of the sputter etch. After first metallization is placed, any subsequent annealing may melt or reflow the first metal causing problems such as poor step coverage, pin holes, hillocks etc. Thus, it is important that plasma etching after the first metallization be carefully controlled in order that damage does not occur since thermal anneal is not longer a suitable option for removing the damage at this stage of semiconductor process. It is important therefore that the plasma etch process be controlled in situ so that the source of wafer surface damage is minimized.

Referring now to the drawings, FIG. 1 illustrates an exemplary conventional rf sputter etching system 10 similar to that shown in U.S. Pat. No. 4,298,443 (herein incorporated by reference). System 10 includes an etching chamber 12 and, placed within chamber 12, is a holder 14. Holder 14 includes a plurality of flat surfaces or facets, each facet is designed to receive a plurality of wafers 16. Each wafer is held in place within aperatures 26 located within a front plate 18 by one or more clips or retainers 20. Front plate 18 constitutes an anode which can be fixedly secured to one facet of holder 14 via clamp 22. Retainers 20 firmly hold each wafer 16 in place against a cathode 24 during times in which plate 18 is secured to holder 14. Cathode 24 is adapted to receive rf power as well as sufficient cooling media necessary to electrically bias the surface of wafer 16 which is brought in electrical contact therewith, and also to cool the wafer during high energy ion bombardment.

Turning now to FIG. 2, a more detailed view of front plate 18 is illustrated. Plate 18 includes a plurality of aperatures 26, each of which sized to accommodate wafer 16. When placed upon holder 14, cathode 24 electrically abuts against the backside surface of wafer 16 to form a conductive path to the substrate of wafer 16. FIG. 2 illustrates four retainers 20 which clamp around the outer lip of wafer 16 as will be described further hereinbelow. Retainer 20 is made of a conductive material such as stainless steel, and is fixed to an insulating material placed at the base of retainer 20, between retainer 20 and front plate 18. The sides of retainer 20 are spaced a distance indicated by reference numeral 28 from a surrounding wall of front plate 18. As is well known in the art, front plate 18 is generally grounded and forms a portion of the system anode. Cathode 24 is therefore much smaller than the anode area and receives rf power from an rf exciter, phase shifter, amplifier, and matching network of common design. It is important that spacing 28 be maintained in an attempt to prevent or reduce shorting or "arcing" between anode (i.e., front plate 18) and wafer 16. If any arcing should occur, deleterious effects may present themselves during the sputter etch routine. It is postulated that arcing is generally caused by rapid accumulation of charge on the insulating surface of the wafer. After the charge builds to a critical value, it may then discharge or "arc" in a path of least resistance from retainer 20 to the closely spaced grounded plate 18. Arcing from wafer 16 to plate 18 is similar to the discharge of a capacitor. At a discharge current density of 0.1 ampere/cm$^2$, a 1 $\mu$m diameter area could receive a charge sufficient to cause the breakdown of the insulating layer (i.e., gate oxide breakdown) in less than 10 ns. A more detailed analysis of arcing and the postulated relationship between arcing and gate oxide breakdown will be described further with respect to FIG. 4 described hereinbelow.

Arcing is less likely to form in rf discharges because the field is maintained in one direction for less than one cycle, and reduces to zero twice in each cycle, making it more difficult for the arc to be sustained. Even so, arcing still may occur due to the accumulation (albeit charge accumulation must be more rapid) of charge such as ions on the self-biased insulator surface. Improper spacing between the wafer and anode only adds to the possibility of arcing. While it is important that the spacing not be too small, it is equally important that the spacing not be too large. Plate 18 must surround wafer 16 as close as possible in order to ensure the anode area is large and that the anode closely shields and confines the boundary area of the plasma completely around the working area of the wafer. Proper location of the "dark space" and plasma with respect to the target (or wafer) is well recognized as crucial to the functionality of the sputter etch chamber.

Referring now to FIG. 3, a more detailed view of plate 18 is shown. Specifically, a single aperature 26 is illustrated within plate 18 without a wafer retained therein. Aperature 26 is therefore of sufficient area to accommodate a wafer. The aperature can be of varying dimension to accommodate a four inch, six inch, eight inch, or larger diameter wafer. Plate 18 is made of a conductive material such as, for example, aluminum or stainless steel, and is preferably connected to a ground terminal associated with chamber 12.

At least one retainer, and preferably three or four retainers 20, are configured within grooves 30 (shown in partial cut-away section), wherein the walls of each groove 30 are spaced about the sides of a respective retainer 20. FIG. 3 illustrates a partially assembled portion of the backside surface of plate 18 without a wafer mounted within aperature 26. Retainer 20 includes an assembly having one end of retainer 20 or base 32 fixedly secured to a ledge portion of plate 18 by a screw 34. A complete description of the operating principles of retainer 20 and the composition of various materials used in retainer 20 are described in U.S. Pat. No. 4,473,455 (herein incorporated by reference). It is understood, when referencing Patent '455, that an inwardly projecting lip 36 is retained over the working surface of a semiconductor wafer, and that planar surface 38 of lip 36 abuts against the working surface.

After being loaded with wafers, plate 18 can be manually or automatically carried to the reaction chamber of system 10 for mounting to one of the facets containing cathode elements 24. The attributes of loading a wafer into an aperature 26 is schematically illustrated and described in an exemplary plasma etch chamber shown in U.S. Pat. No. 4,473,455. It is understood, however, that the retainer mechanism and etch chamber shown in Patents '443 and '455 are presented for exemplary purposes only.

Referring now to FIG. 4, a cross-sectional view of a loaded wafer 16 within plate 18 is shown. In particular, wafer 16 can be clamped or retained against the upper surface of cathode 22 by the protruding member or lip 36 of retainer 20. After processing, wafer 16 held in position within plate 18, can be easily removed. This is done by moving the associated spring elements of each retainer 20 toward the front side of plate 18 while engaging the backside of wafer 16 with a standard vacuum chuck. In such a way, the wafer can then be easily removed from its mounted position via the backside of plate 18.

The arcing phenomena described above generally occurs by the accumulation of charge on the insulating surface of wafer 16, and the transferral of that charge to and from grounded plate 18. Specifically, charge accumulates in the insulating regions, or contact windows, formed within areas 40 void of first metallization layer 42. Accumulation of charge can present itself, for example, as negative charge and, after a suitable accumulation has occurred, the charge may discharge through underlying dielectric layer 44, as shown. Dielectric layer 44 is an insulative material such as an oxide or spin-on glass (e.g., BPSG) well known in the art. Dielectric layer 44 is generally reduced or thinned during etch at select areas in order to allow contact to be made during the deposition of second metallization layer (not shown). The areas being thinned or removed over gate regions may cause significant electric field in those gate areas. It is well known that electric field, E, described by Coulomb's law and Gauss's law is more intense, i.e., has a greater force per unit charge in areas of thin insulative oxide such as gate oxide as described by Cheng, D., "Field and Wave Electromagnetics," Addison-Wesley Publ. Co., 1983, pp. 1–128, electromagnetic force energy between two points 1 and 2 can be expressed as follows:

$$F_{12}=a_{R12}kq_1q_2/(R_{12})^2,$$

where, $F_{12}$ is the vector force exerted by $q_1$ and $q_2$, $q_1$ and $q_2$ is the electronic charge 1.6×10−19 Coulombs, $a_{R12}$ is a unit vector in the direction from $q_1$ to $q_2$, $R_{12}$ is the distance between charges $q_1$ and $q_2$, and k is the well known proportionality constant of silicon dioxide and silicon. The electric field intensity, E, can then be expressed as the force per unit charge or $F_{12}/q$ within the semiconductor, whereby electric field is as follows:

$$E = a_{R_{12}} q / 4\pi \epsilon_o R_{12}^2, \text{ or } E = Q/C^*L,$$

where, Q is the charge on the gate capacitor plate, $\epsilon_o$ is the well known permittivity of a dielectric medium (e.g., gate oxide 46), C is the gate capacitance, and L is the distance between opposite charge. It is important to note that E field is inversely proportional to the thinnest insulative region or gate oxide region due to the well known fact that the gate oxide is much thinner than the field oxide or glass regions.

Gate oxide breakdown associated with arcing generally occurs by the attractive forces of charges $q_1$ and $q_2$, where charges $q_1$ and $q_2$ are of opposite sign. Charges being attracted to one another across gate oxide 46 during etch pre-second metallization causes the gate concentration underneath the gate oxide, i.e. within the gate channel region 48, to sweep charges therefrom, resulting in a lower than optimal concentration of majority carriers. Thus, the charge within the channel region is attracted to and responds to a charge upon the gate as shown in FIG. 4. It is postulated that the attraction of charges may degrade the gate oxide if the amount of charge exceeds a critical level. Once a threshold amount of charge is allowed to accumulate, gate oxide breakdown may occur. Furthermore, lowering of concentration resulting from charge transferral within the channel region may skew the threshold voltage and flat-band voltage of the active device.

The mobility of the charge within substrate 50 and between channel region and grounded plate 18 adds to the electric field present within the gate oxide and compounds the problems described above. Transferral of charge from the substrate to plate 18 via retainer 20 only occurs when there is an arcing between plate 18 and retainer 20 in the low resistive path of spacing 28.

In order to reduce gate oxide breakdown or performance skews associated with charge concentration variability of the channel region, it is necessary to reduce the amount of charge underneath gate oxide 46. It has been presently determined that gate oxide damage and associated performance skews are primarily associated with p-channel transistors. The n-channel transistors placed within p-wells do not exhibit significant gate oxide breakdown after many production wafers were tested over a period of months. The n-channel test transistors exhibited a high degree of affinity toward gate oxide breakdown test voltages, however, the p-channel test transistors did not. As such, significant reduction in yield occurs on many devices incorporating CMOS process or any device having a p-channel transistor. It is postulated that the reason why n-channel transistors do not exhibit the problem is due to the depletion region formed between the p-well and underlying n-type substrate. The depletion region substantially prevents migration of charge to and from the n-channel gate oxide. The depletion region provides a barrier against migration of charges through the substrate from and to grounded plate 18. Instead of entering the n-channel active areas, it is assumed that the charge predominately migrates toward the p-channel regions instead, thereby causing deleterious effects therein. Repeated applications of high field inversion weakens the insulating properties of the gate oxide. If a large quantity of charge is present in the oxide or at the oxide/silicon interface, the effect will accelerate the breakdown due to lower field resistance.

Although wafer retainers, such as those shown in FIGS. 1–4, greatly enhance the throughput of plasma etching associated with rf sputtering, retainers 20 and their close spacing to anodes 18 can allow arcing and significant damage to the surface being etched. Due to the nature of sputter etching and associated electric field, any charge accumulation upon the insulating surface can cause arcing and problems of charge transferral described above. It is important when designing a sputter etch system, that the arcing phenomena be controlled or substantially reduced. It is therefore imperative that a sputter etch system be designed, or a wafer placed within the system be designed such that charge transferral arcing is minimized. The solution chosen must be cost effect and capable of being retrofitted to exiting sputter etch chambers. Still further, it might also be advantageous that modifications be made to the wafer instead of the chamber provided modification can be easily achieved without additional wafer processing steps and/or masks.

SUMMARY OF THE INVENTION

The problems outlined above are solved by an improved sputter etching technique utilizing either a modified sputter etching chamber or a modified wafer placed within the chamber. The etch chamber or apparatus can be modified to incorporate a diode at select areas upon the apparatus in order to prevent charge transferral from the anode, through the wafer substrate, and onto the lower surface of the gate oxide or vice-versa. Alternatively, a diode can be formed in inactive regions of the wafer directly underneath the retainer in order to prevent charge transferral therethrough. In either design, the diode can be easily placed, simply maintained, and its function repeatedly performed to prevent charge transferral and problems associated with arcing.

The improved sputter etch technique described herein is optimally used after first metal deposition. The improved sputter technique minimizes interstitual damage and specifically avoids the problems of post-metallization annealing. Advantageously, damage is minimized at the source rather than having to remove the damage after it is introduced—as is the case in post-etch anneal. Any post-etch anneal (after metallization) would only melt or reflow the previously deposited metallization to the detriment of the integrated circuit. The improved sputter etch technique herein is therefore well suited to post metallization sputter etching and provides advantages not present in conventional sputter etching.

Broadly speaking, the present invention contemplates an improved technique for minimizing the onset of plasma etch damage occurring at the plasma etch operation. Specifically, the improved technique, according to one embodiment, includes a semiconductor wafer and at least one diode formed within an inactive region of the wafer near the outer periphery of the wafer. The diode is capable of electrical connection to an overlying retainer, wherein the retainer is spaced from an anode within a sputter etch chamber. Advantageously, the sputter etch chamber can be a conventional non-retrofitted chamber, and any modification need only be made to the wafer placed within the chamber. Thus, depletion regions necessary for reducing plasma etch damage can be solely attributed to a diode or diodes formed within the wafer using normal processing flow. The diode and modulated depletion region is formed within the wafer directly underneath the clip ring area. The diode will reduce the amount of charge moving from anode ground to the gate oxide in similar manner to the diode formed between the p-well and underlying n-type substrate associated with n-channel active devices. The diode or diodes formed within the inactive region comprises a p-doped region diffused into the n-type substrate, and can also include a first metallization placed in electrical contact with the p-doped region.

It is further contemplated that, accordingly to an alternative embodiment, the p-doped region of the diode can be placed in the n-type substrate absent an overlying metallization layer. According to the alternative embodiment, the retainer or clip ring can therefore contact directly the p-doped region instead of contacting the dopant through an overlying metallization.

According to yet another embodiment, a diode and associated depletion region can be placed on a separate monolithic circuit, e.g., as a discrete device between the ground terminal and plate 18. Instead of placing the diode within the same monolithic circuit of wafer 16, the diode can be a discrete device retrofitted to conventional rf sputtering systems to provide a blockage of charge carrier migration from the ground terminal to the gate oxide or vice-versa.

The present invention still further contemplates a method for manufacturing a device capable of reducing plasma etch damage occurring after the deposition of a first metallization layer. The method is a processing method for forming a plurality of p-channel transistors within the active region and, within the same process step and using the same mask, forming at least one p-doped region within an inactive region. The inactive region is located at the periphery of the wafer substantially surrounding the active region. The p-doped area is preferably in substantial alignment with a retainer spaced from an anode associated with a conventional sputter etch chamber. Specifically, the p-doped area resides underneath and is in electrical communication with a retainer clamped against the upper surface of the wafer, wherein the wafer is firmly held between the retainer and the upper surface of an rf-powered cathode. A first metallization layer can then be placed over the entire wafer, and certain portions of the first metallization layer can be removed within the active region to form conductive interconnect. A subsequent second metallization layer can be formed over insulating material placed over the first metallization layer. The second metallization layer contacts underlying surface topography (preferably conductive layers) by sputter etching native oxides formed after first metallization and within contact vias placed therein. The second metallization step can therefore provide conductive interface using prior second metallization sputter etching without having to perform anneal after first metallization deposition or etch.

BRIEF DESCRIPTION OF THE DRAWINGS

Other objects and advantages of the invention will become apparent upon reading the following detailed description and upon reference to the accompanying drawings in which.

Figure 1:
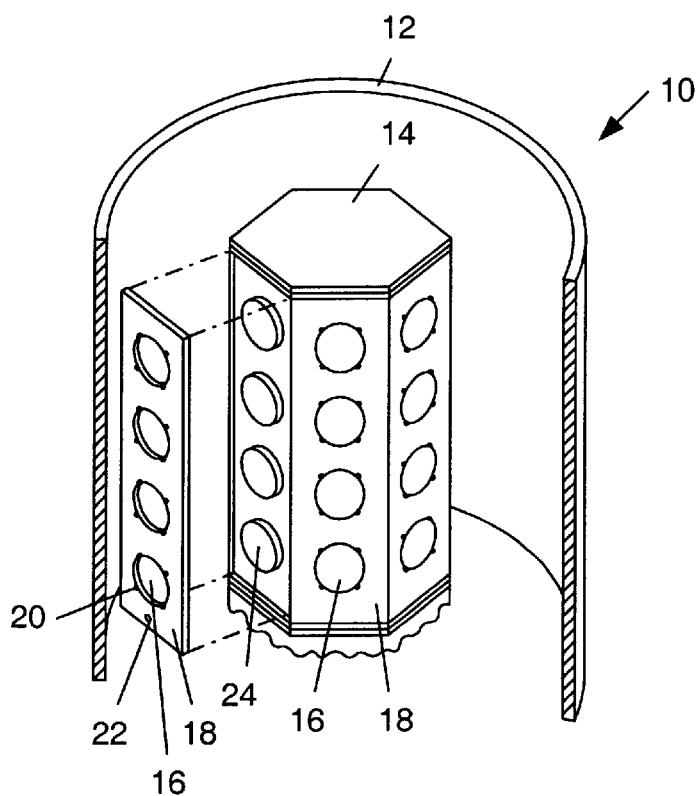
FIG. 1 is an elevational view of a portion of a sputter etch system and associated reaction chamber according to a prior design.
Figure 2:
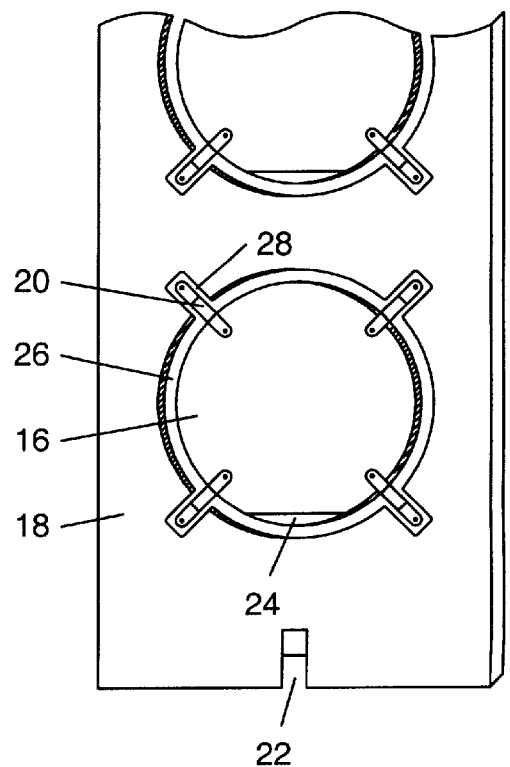
FIG. 2 is an elevational view of a portion of a wafer carrying front plate and wafer retainers according to a prior design.
Figure 3:
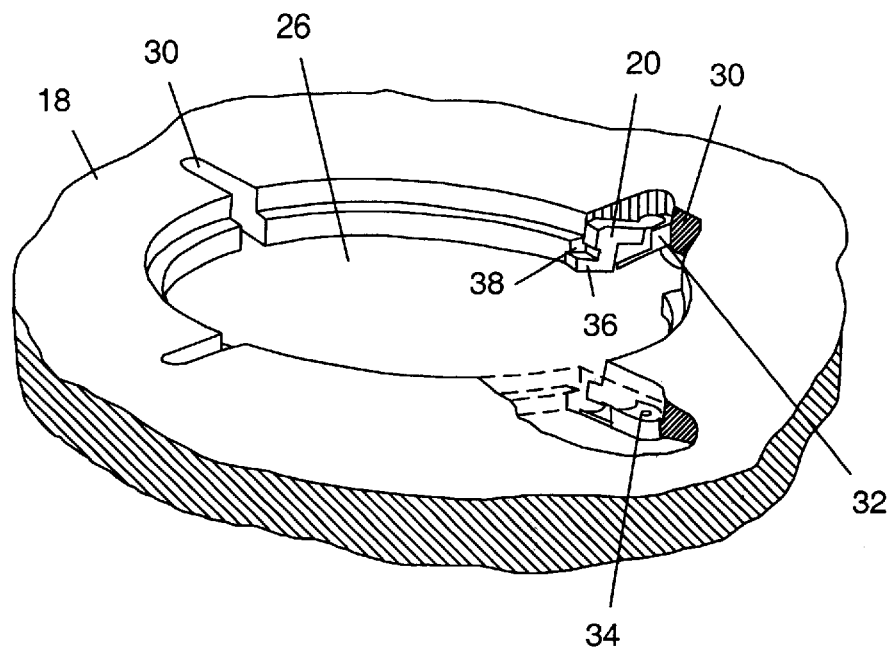
FIG. 3 is an elevational view of a portion of the wafer carrying front plate and detail view of the wafer retainers according to a prior design.

While the invention is susceptible to various modifications and alternative forms, specific embodiments thereof are shown by way of example in the drawings and will herein be described in detail. It should be understood, however, that the drawings and description thereto are not intended to limit the invention to the particular forms disclosed, but on the contrary, the intention is to cover all modifications, equivalents and alternatives falling within the spirit and scope of the present invention as defined by the appended claims.

DETAILED DESCRIPTION OF THE INVENTION

Figure 5:
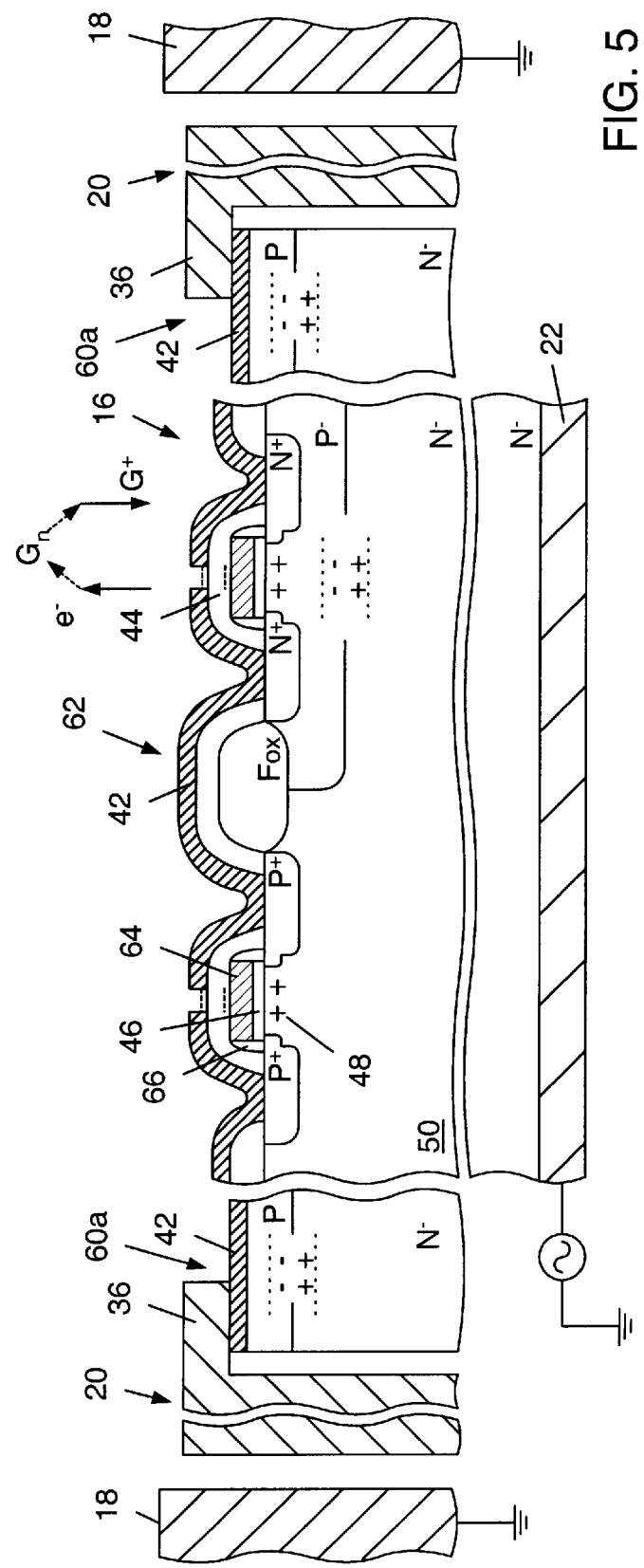
FIG. 5 is a cross-sectional view of the wafer carrying front plate, wafer retainers, wafer and rf-powered cathode according to an exemplary embodiment of the present invention.

Turning now to the drawings, FIG. 5 illustrates a cross-sectional view of the wafer carrying front plate 18, wafer retainers 20, wafer 16, and RF-powered cathode 22 according to the present invention. In particular, a diode 60a is formed near the outer periphery of wafer 16 in the areas abutting against protruding lip 36 of retainer 20. Diode 60a is formed by defusing or ion implanting within inactive regions a p-dopant into the n-type substrate. Diode 60a is purposefully spaced from the active regions of die placed across wafer 16. A portion of an active region 62 is shown illustrating various topographical layers, including first metallization layer 42, dielectric layer 44, polysilicon conductor 64, and underlying gate oxide 46. A spacer 66 may be employed to provide lightly doped regions similar to conventional lightly doped drain technology.

Diode 60a, shown in FIG. 5, includes a p/n junction underlying a first metallization layer 42. Metallization layer 42 provides contact between protruding region 36 and the p-doped region of diode 60a. A depletion region or layer generally forms at the junction of the n-type substrate and p-doped region generally whenever the junction is biased. The depletion layer is typically defined as a layer substantially void of charge carriers, and therefore no current can flow through the region. This is why a semiconductor diode will not conduct in the reverse direction or will not conduct in a forward direction unless it is biased beyond a threshold amount. The depletion layer accesses a dielectric, and in fact, a reverse-biased diode can be used as a capacitor in some instances. A depletion region can also form in the forward bias condition. Generally speaking, the depletion layer is much smaller in the forward bias condition as opposed to the reverse bias condition. Nevertheless, in either condition, a charge density distribution of positive charges can exist separate from negative charges thus forming the depletion region at the junction, as shown in FIG. 5. In order for charge to be transported through the depletion region, voltage placed across the diode must exceed a critical value. It is contemplated that either a forward-biased or reverse-biased diode can be utilized to provide sufficient depletion region to prevent movement of charge therethrough. Preferably, diode 60a is configured in reverse-biased condition in order to ensure significant voltage placed thereacross will not allow charge carrier mobility. A description of the p/n junction diode and its characteristics is generally provided in Neudeck, G., et al., "Modular Series on Solid State Devices", Vol. 2, Addison-Wesley Publ. Co., 1983, pp. 15–36. Reference to the basic operation of p/n junction diodes is therefore well-known and can be found in the above reference.

It is important to note that diode 60a functions similar to the p-well/n-type substrate interface associated with n-type devices. As such, the p-doped region of diode 60a functions similar to the p-well region of n-type devices and, accordingly diode 60a provides the same advantages as the p-well in preventing or substantially eliminating the amount of charge transported underneath the gate oxide of p-channel devices. Thus, diode 60a prevents p-channel gate failures which can often rise during the operation of, for example, a model no. 3180/3190/3280/3290 sputter etch device manufactured by Varian Associates, Inc. of Palo Alto, Calif.

Figure 6:
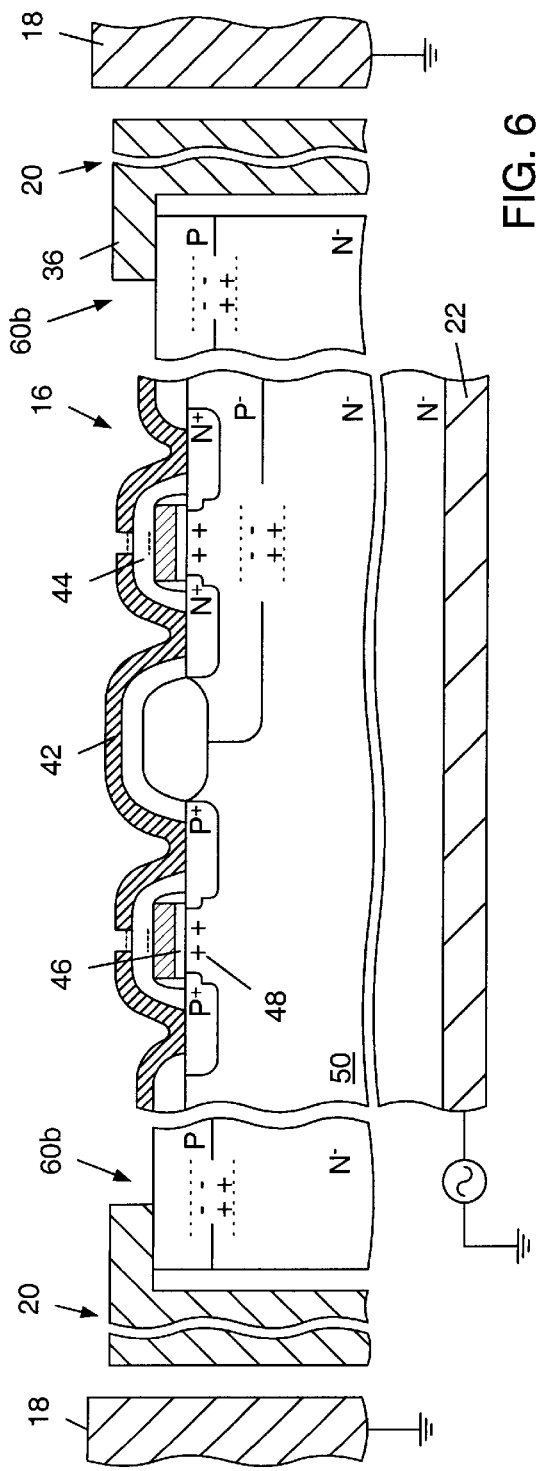
FIG. 6 is a cross-sectional view of the wafer carrying front plate, wafer retainers, wafer and rf-powered cathode according to an alternative exemplary embodiment of the present invention.

According to an alternative embodiment, FIG. 6 illustrates protruding portion 36 of retainer 20 placed directly upon a p-doped region of diode 60b. In particular, diode 60b is processed and operates identical to diode 60a, except that a contacting first metallization layer is removed prior to placement within a sputter etch chamber. Thus, retainer 20 contacts directly to the p-doped region of diode 60b. An advantage in using an overlying metallization layer 42 as shown in FIG. 5, is that the metallization layer can be made quite large to encompass the entire inactive region outside and separate from the active die area. Large surface area metallization 42 can therefore source and sink larger amounts of mobil charge, and can also provide better contact to underlying p-doped areas. The underlying p-doped areas can be quite large (similar to the overlying metal) or somewhat small and directly underneath protrusion 36. An advantage in not having an overlying metallization 42 is that the detrimental effects of an arced charge can be localized to a small portion of the wafer surface. Furthermore, not having an overlying metallization layer 42 reduces processing complexity by not having an additional masking layer and associated etching, etc.

Figure 7:
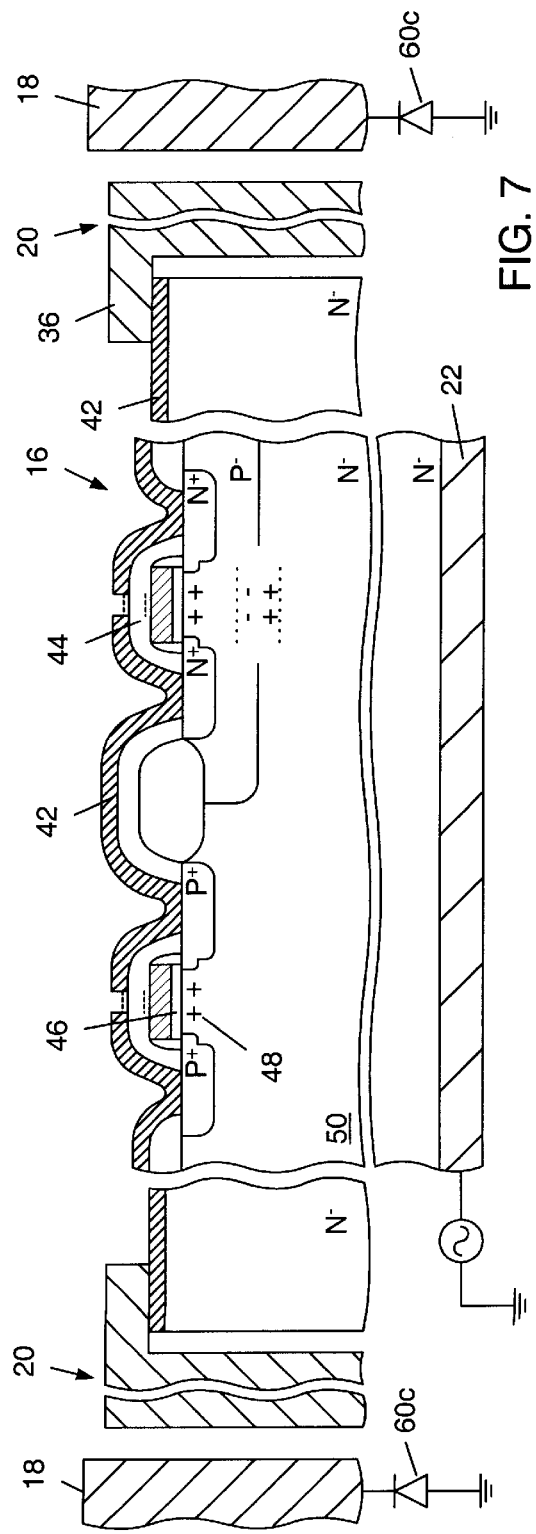
FIG. 7 is a cross-sectional view of the wafer carrying front plate with retrofitted rectifying diode, wafer retainers, wafer and rf-powered cathode according to yet another alternative exemplary embodiment of the present invention.

Referring now to FIG. 7, a still further alternative embodiment is shown. Specifically, wafer 16 can be fabricated without embodying a diode near the periphery of the wafer. Instead, the diode can be placed as a separate discrete device between plate 18 and the ground terminal. Diode 60c, and associated depletion region, functions identical to diodes 60a and 60b. Instead of placing the diode on the wafer, a standard wafer without an embedded diode can be utilized in a retrofitted etch system 10. In either case, regardless of whether the wafer is modified or the etching system is modified, a diode can be utilized to prevent arcing and deleterious effects thereof. In certain instances, it may be advantageous to retrofit the sputter etch chamber using existing wafers which have not been formed by masks having additional p-doped inactive diffusion regions. In other instances, it might be advantageous to utilize conventional RF sputtering chambers but to simply change a single mask and add the necessary p-doped areas. In either case, a similar result can be achieved.

Figure 8:
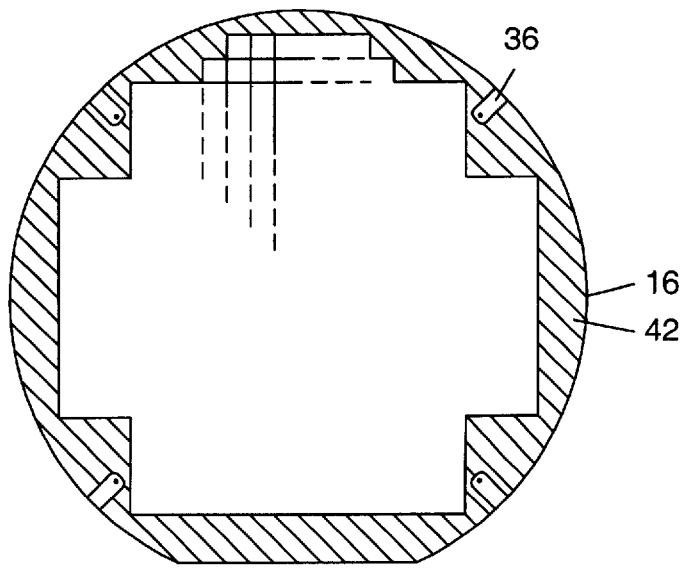
FIG. 8 is a plan view of a wafer processed according to the embodiment illustrated in FIG. 5.
Figure 4:
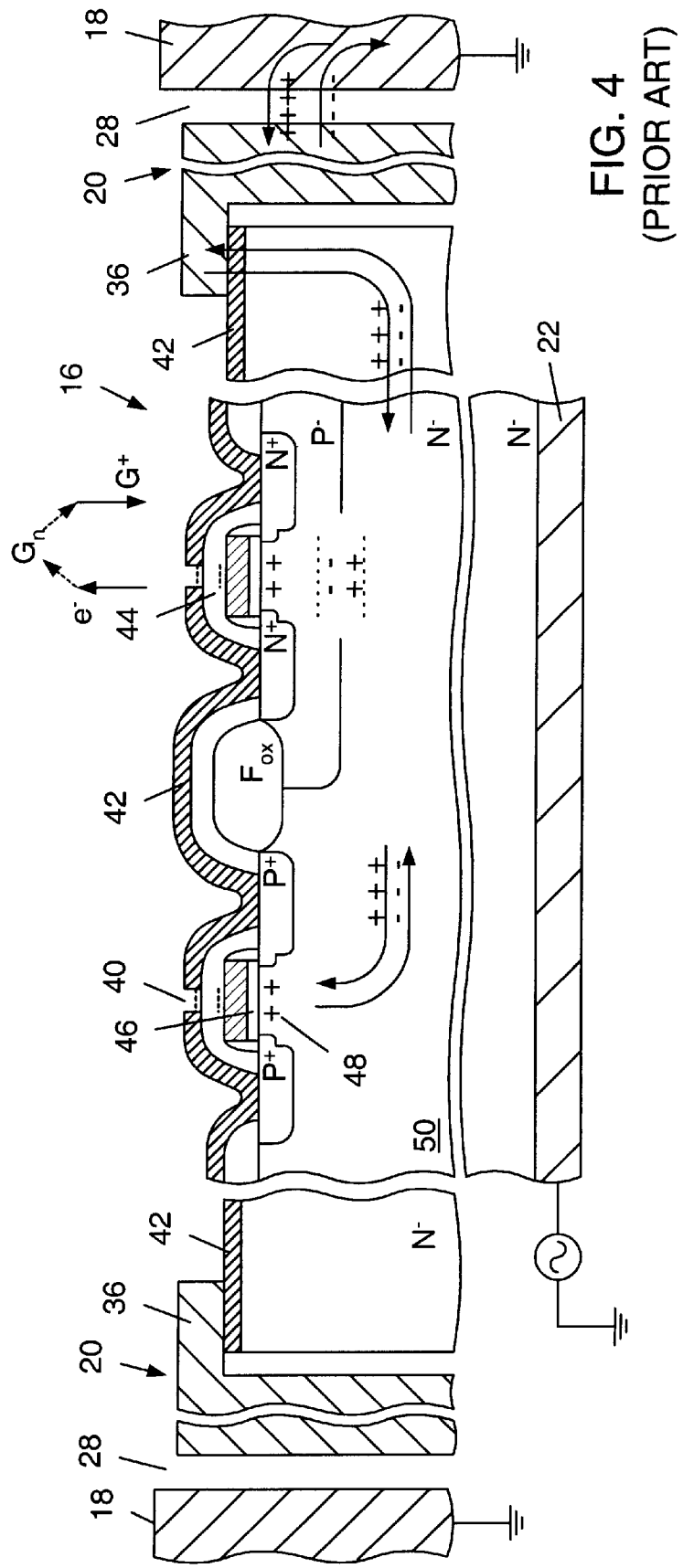
FIG. 4 is a cross-sectional view of the wafer carrying front plate, wafer retainers, wafer and rf-powered cathode according to a prior design.
Figure 9:
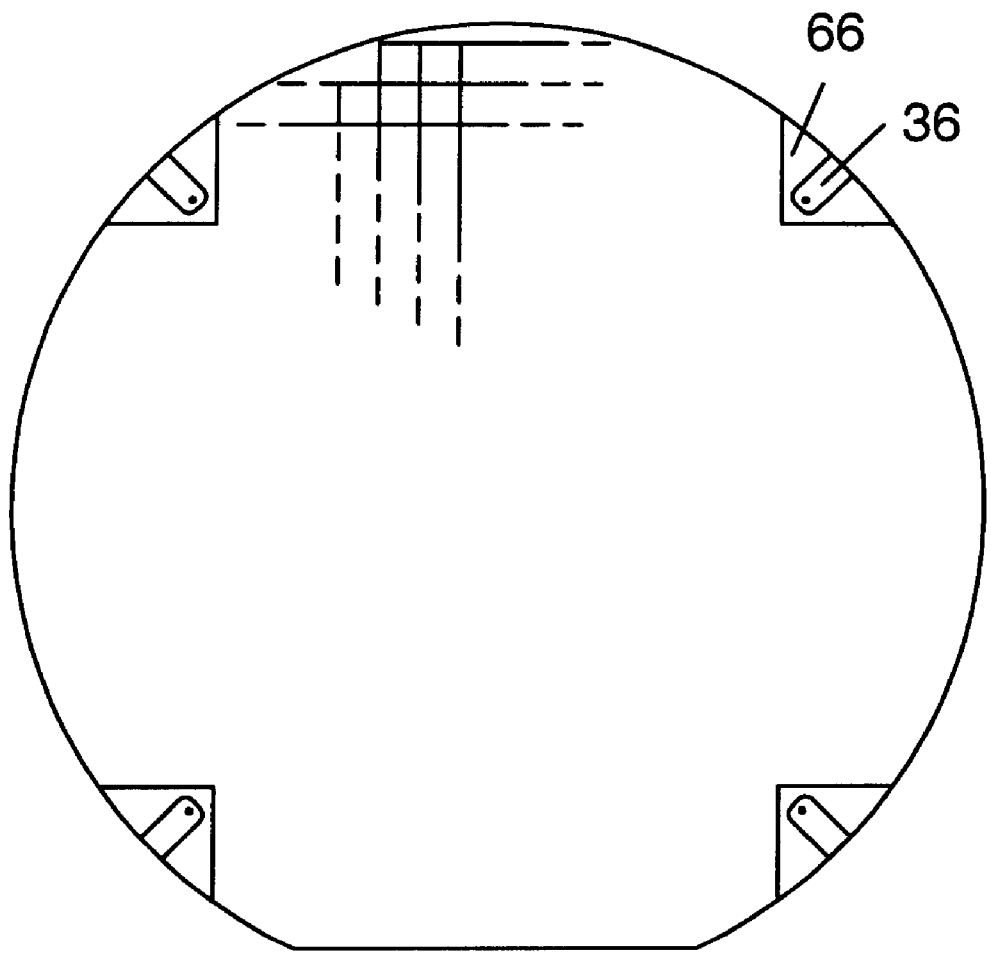
FIG. 9 is a plan view of a wafer processed according to the embodiment illustrated in FIG. 6.

Referring now to FIG. 8, a top plan view of wafer 16 fabricated according to the embodiment illustrated in FIG. 5 is shown. Wafer 16 includes a metallization layer 42 (i.e., first metallization layer) placed in inactive regions near the periphery of the wafer as shown by the cross-hatched area. Select areas of the inactive region having overlying metallization can be contacted by protrusion 36 as shown. By having metallization cover a substantial portion of the inactive region, accurate placement of underlying p-doped areas beneath and in alignment with protrusion 36 is not necessary. Instead, metallization 42 can provide a conductive path to a diode formed somewhere within the inactive region. Advantageously, the diode can be arranged in a contiguous area which is somewhat large but offset from the overlying protrusion 36. Conversely, metallization layer 42 can be removed or etched prior to wafer 16 insertion into chamber 12, as shown in FIG. 9. In such an instance, the p-doped region 66 must be formed in alignment with and directly underneath protrusion 36 of retainer 20. Accordingly, the p-doped region, absent an overlying metallization layer shown in the embodiment of FIGS. 6 and 9, must be in substantial alignment with protrusion 36 in order for the associated diode 60b to be active and useful.

Using diode designs 60a, 60b or 60c can provide necessary protection against charge migration and associated arcing and therefore substantially prevent the problems described above in connection with an integrated formed having p-channel devices. An important advantage of incorporating diodes 60a and 60b within the wafer's inactive region, is that the p-doped areas necessary for forming the diodes can be easily incorporated into either a step-and-repeat reticle or upon an entire wafer mask. The p-doped regions are defined by the same mask or reticle as that used to defuse or implant the p-doped source and drain regions within the active areas. Thus, no additional masks are needed, and no further processing steps are required to incorporate the diodes. Additionally, metallization layer 42 placed within the inactive region is similar to and is formed using the same mask as the metallization layer necessary for providing first layer metallization within the active die areas. Again, no additional masks are needed and, if the inactive region metallization requires removal, an opposite density masking of the metallization mask can be easily achieved in the inactive region to provide that function.

It will be appreciated to those skilled in the art having the benefit of this disclosure that this invention is believed to be capable of applications with numerous types of wafers employing CMOS or p-type active devices, and can be utilized in conventional rf-sputtering chambers, or slightly modified rf-sputtering chambers. Furthermore, it is also to be understood that the forms of the invention shown and described are to be taken as presently preferred embodiments. Various modifications and changes may be made without departing from the spirit and scope of the invention as set forth in the claims. An exemplary modification might be one which uses a dissimilar sputter etch chamber configuration not having facets or a centralized cathode system. All that is necessary is that the wafers be retained against a cathode using one or more retainers or clips arranged about the periphery of the wafer. Any wafer which employs a retainer mechanism arranged at the periphery of the wafer can be modified according to the advantages described above to include a diode placed within the wafer's inactive region. It is intended that the following claims be interpreted to embrace all such modifications and changes.

What is claimed is:

1. A device for reducing plasma etch damage occurring within a sputter etch chamber, comprising:

an anode spaced from a retainer of a sputter etch chamber;

said retainer retaining a semiconductor wafer having an inactive region and an active region;

at least one diode formed within said inactive region of said wafer near the outer periphery of said wafer; and said diode is capable of electrical connection to said retainer.

2. The device as recited in claim 1, wherein said semiconductor wafer comprises a plurality of p-type transistors formed within the active region of said wafer.

3. The device as recited in claim 2, wherein said semiconductor wafer comprises an n-type.-substrate placed between said p-type transistors and said diode.

4. The device as recited in claim 1, wherein said diode comprises a p-doped region formed within an n-type substrate.

5. The device as recited in claim 4, wherein said diode further comprises a first layer of metallization deposited over said p-doped region, said first layer having sufficient area to make electrical contact with said retainer.

6. The device as recited in claim 1, wherein said retainer comprises a clip configured to retain said wafer against a cathode within said sputter etch chamber.

7. A device for reducing plasma etch damage occurring after the deposition of a first metallization layer, comprising:
- a sputter etch chamber having an rf-powered cathode and a grounded anode;
- a semiconductor wafer having an n-type substrate electrically retained against said cathode by at least three retainers, each said retainer is spaced from said anode;
- a plurality of active regions including p-channel transistors formed within said n-type substrate, each said p-channel transistor having a gate channel region formed between a source and drain;
- at least three p-doped areas formed within said n-type substrate at inactive regions of said n-type substrate to form at least three diodes near the outer periphery of said wafer and underneath each said retainer, each said diode includes an interface between said p-doped area and said n-type substrate; and
- said interface between said p-doped area and said n-type substrate substantially prevents transfer of charge between said grounded anode and said gate channel region during activation of said sputter etch chamber.

8. The device as recited in claim 7, wherein each said p-doped area includes an overlying first metallization layer deposited directly upon said p-doped area.

9. The device as recited in claim 7, wherein said sputter etch chamber includes a plasma formed adjacent said wafer and a plurality of ions ejected from said plasma and onto an insulator surface at the upper surface of said wafer, whereby said ions etch said insulator surface upon striking the insulator surface.

10. The device as recited in claim 9, wherein said insulator surface includes oxides formed after a first metallization layer deposition and before a second metallization layer deposition.

11. The device as recited in claim 9, wherein said insulator surface includes oxides formed at contact openings between an overlying second metallization layer and an underlying wafer topography.

12. The device as recited in claim 7, wherein said interface between said p-doped area and said n-type substrate substantially prevents arcing at the space between said retainer and said anode.

13. A device for electrical connection to a sputter etch chamber for reducing plasma etch damage occurring after the deposition of a first metallization layer, comprising:
- a sputter etch chamber having an anode and an rf-powered cathode;
- a semiconductor wafer having a plurality of p-channel transistors and associated gate channel regions formed within an n-type substrate;
- at least three retainers spaced from said anode for retaining said wafer against said cathode; and
- a diode connected between a ground terminal and said anode, said diode is configured for substantially preventing transfer of charge between said grounded anode and said gate channel region during activation of said sputter etch chamber.

14. The device as recited in claim 13, wherein a depletion region substantially prevents arcing at the space between said retainer and said anode.

* * * * *